(12) United States Patent
Kim

(10) Patent No.: US 9,379,116 B1
(45) Date of Patent: Jun. 28, 2016

(54) FABRICATION OF A DEEP TRENCH MEMORY CELL

(71) Applicant: GLOBALFOUNDRIES INC., Grand Cayman (KY)

(72) Inventor: Byeong Y. Kim, Lagrangeville, NY (US)

(73) Assignee: GlobalFoundries, Inc., Grand Cayman (KY)

( * ) Notice: Subject to any disclaimer, the term of this patent is extended or adjusted under 35 U.S.C. 154(b) by 0 days.

(21) Appl. No.: 14/642,909

(22) Filed: Mar. 10, 2015

(51) Int. Cl.
| | |
|---|---|
| *H01L 27/108* | (2006.01) |
| *H01L 21/84* | (2006.01) |
| *H01L 29/66* | (2006.01) |
| *H01L 21/311* | (2006.01) |
| *H01L 21/306* | (2006.01) |
| *H01L 27/102* | (2006.01) |
| *H01L 27/07* | (2006.01) |

(52) U.S. Cl.
CPC .... *H01L 27/10879* (2013.01); *H01L 21/30604* (2013.01); *H01L 21/31116* (2013.01); *H01L 21/84* (2013.01); *H01L 21/845* (2013.01); *H01L 27/0733* (2013.01); *H01L 27/1026* (2013.01); *H01L 27/10805* (2013.01); *H01L 27/10858* (2013.01); *H01L 27/10861* (2013.01); *H01L 27/10867* (2013.01); *H01L 29/6656* (2013.01)

(58) Field of Classification Search
CPC ............ H01L 27/10879; H01L 21/845; H01L 21/30604; H01L 21/31116; H01L 27/10805; H01L 27/10867; H01L 27/1026; H01L 27/10858; H01L 27/10861; H01L 27/10864; H01L 27/0733
See application file for complete search history.

(56) References Cited

U.S. PATENT DOCUMENTS 7,635,893 B2 * 12/2009 Weis .................. H01L 27/10876
257/330

* cited by examiner

*Primary Examiner* — Thanhha Pham
(74) *Attorney, Agent, or Firm* — Yuanmin Cai; Hoffman Warnick LLC

(57) ABSTRACT

A method including forming a buffer layer between a top pad layer and a bottom pad layer all above a deep trench capacitor embedded in a substrate, forming a fin pattern, defined by one or more sidewall spacers, above the top pad layer using a sidewall image transfer technique, transferring the fin pattern into the top pad layer stopping of the buffer layer, and forming a fin in direct contact with a strap by transferring the fin pattern into the buffer layer, into the bottom pad layer, and into the substrate and an inner electrode of the deep trench capacitor, the fin is formed from a portion of the substrate and the strap is formed from a portion of the inner electrode of the deep trench capacitor.

20 Claims, 13 Drawing Sheets

US 9,379,116 B1

FABRICATION OF A DEEP TRENCH MEMORY CELL

BACKGROUND

The present invention generally relates to semiconductor device manufacturing, and more particularly to fabricating a deep trench memory cell using a buffered sidewall image transfer technique.

Semiconductor device manufacturing generally includes various steps including a patterning process. For example, the manufacturing of a semiconductor chip may start with, for example, CAD (computer aided design) generated device patterns and may continue with the effort to replicate these device patterns in a substrate in which semiconductor devices can be formed. The replication process may involve the use of a photolithography process in which a layer of photo-resist material may be first applied on top of a substrate, and then be selectively exposed according to a pre-determined device pattern. Portions of the photo-resist that are exposed to light or other ionizing radiation (e.g., ultraviolet, electron beams, X-rays, etc.) may experience some changes in their solubility to a certain solution. Next, the photo-resist may be developed in a developer solution, thereby removing the non-irradiated (in a negative resist) or irradiated (in a positive resist) portions of the resist layer, to create a photo-resist pattern. The photo-resist pattern may subsequently be copied or transferred to the substrate underneath the photo-resist pattern.

Engineers are continuously facing the challenge of how to meet the market demand for ever increasing device density. One technique for tight pitch patterning is to achieve nearly twice the pattern density through a technique called sidewall image transfer (SIT), also known as sidewall spacer image transfer. A typical SIT process can include lithographically forming a mandrel above a substrate from a photo-resist material or other suitable material. A material suitable for forming sidewall spacers is subsequently deposited on top of the mandrel and to eventually form sidewall spacers next to the mandrel. The mandrel can then be removed selective to the sidewall spacers and the remaining sidewall spacers can define the desired device pattern. The device pattern defined by the sidewall spacers may generally be transferred into the substrate. The SIT technique may be used to produce the fins for multiple fin field effect transistors (hereinafter "finFET") within a finFET device region. Typically, regions of a wafer not designated as the finFET device region may be recessed below a top surface of the fins. The regions of the wafer not designated as the finFET device region may be designated as a planar device region.

SUMMARY

According to an exemplary embodiment of the present invention, a method is provided. The method may include forming a buffer layer between a top pad layer and a bottom pad layer, the bottom pad layer being on top of a deep trench capacitor embedded in a substrate, forming a fin pattern above the top pad layer using a sidewall image transfer technique, the fin pattern is defined by one or more sidewall spacers, such that at least one of the one or more sidewall spacers is directly above and aligned with at least a portion of the deep trench capacitor, transferring the fin pattern into the top pad layer stopping of the buffer layer, and forming a fin in direct contact with a strap by transferring the fin pattern into the buffer layer, into the bottom pad layer, and into the substrate and an inner electrode of the deep trench capacitor, the fin is formed from a portion of the substrate and the strap is formed from a portion of the inner electrode of the deep trench capacitor.

According to another exemplary embodiment of the present invention, a method is provided. The method may include forming a deep trench capacitor embedded in a semiconductor-on-insulator substrate, forming a dielectric collar around an upper portion of an inner electrode of the deep trench capacitor such that a portion of the inner electrode remains in direct contact with a top semiconductor layer of the semiconductor-on-insulator substrate, forming a buffer layer between a top pad layer and a bottom pad layer, the bottom pad layer being on top of the deep trench capacitor and on top of the semiconductor-on-insulator substrate, forming a fin pattern above the top pad layer using a sidewall image transfer technique, the fin pattern is defined by sidewall spacers, such that at least one of the sidewall spacers is directly above and aligned with at least a portion of the deep trench capacitor, removing a portion of the top pad layer selective to the sidewall spacers and selective to the buffer layer such that another portion of the top pad layer remains directly beneath the sidewall spacers, and forming a fin in direct contact with a strap by transferring the fin pattern from the top pad layer into the top semiconductor layer and the inner electrode of the deep trench capacitor, the fin is formed from a portion of the top semiconductor layer and the strap is formed from a portion of the inner electrode of the deep trench capacitor.

According to another exemplary embodiment of the present invention, a method is provided. The method may include forming a buffer layer between a top pad layer and a bottom pad layer, the bottom pad layer being on top of a deep trench capacitor embedded in a substrate, the top pad layer being made from a nitride, the buffer layer being made form amorphous silicon, and the bottom pad layer being made from an oxide, forming a fin pattern above the top pad layer using a sidewall image transfer technique, the fin pattern is defined by one or more sidewall spacers, such that at least one of the one or more sidewall spacers is directly above and aligned with at least a portion of the deep trench capacitor, transferring the fin pattern into the top pad layer stopping of the buffer layer, and forming a fin in direct contact with a strap by transferring the fin pattern into the buffer layer, into the bottom pad layer, and into the substrate and an inner electrode of the deep trench capacitor, the fin is formed from a portion of the substrate and the strap is formed from a portion of the inner electrode.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
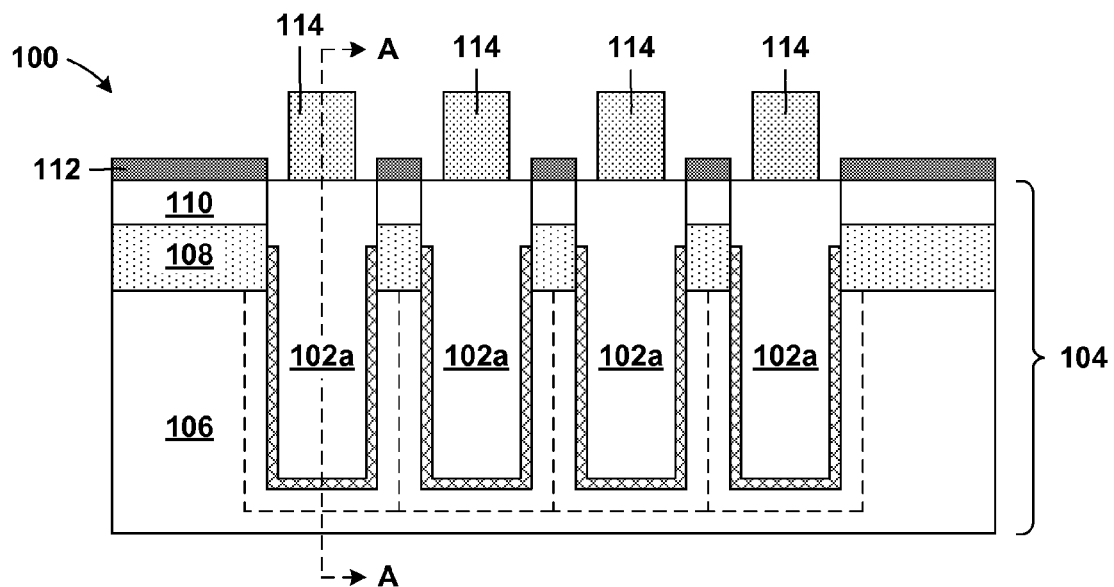
FIG. 1 illustrates forming a strap mask above deep trench capacitors in a substrate according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Current sidewall image transfer (SIT) techniques described above may have drawbacks including, degradation or undercutting of one or more patterning layers immediately beneath the sidewall spacers. Embodiments of the present invention generally relate to integrating a buffer layer into a stack of patterning layers beneath the sidewall spacers used to fabricate a deep trench memory cell.

The present invention generally relates to semiconductor device manufacturing, and more particularly to fabricating a deep trench memory cell using a buffered sidewall image transfer technique. More specifically, a buffer layer may be used to prevent unwanted degradation of an underlying semiconductor material during patterning of a strap for a deep trench memory cell. One way to fabricate the deep trench memory cell using the buffered sidewall image transfer technique is described in detail below by referring to the accompanying drawings FIGS. 1-10. Each of the figures, unless specified otherwise, is a cross section of a portion of a semiconductor wafer and may illustrate a representative deep trench memory cell, and manufacture thereof, for purposes of the following description.

Figure 1A:
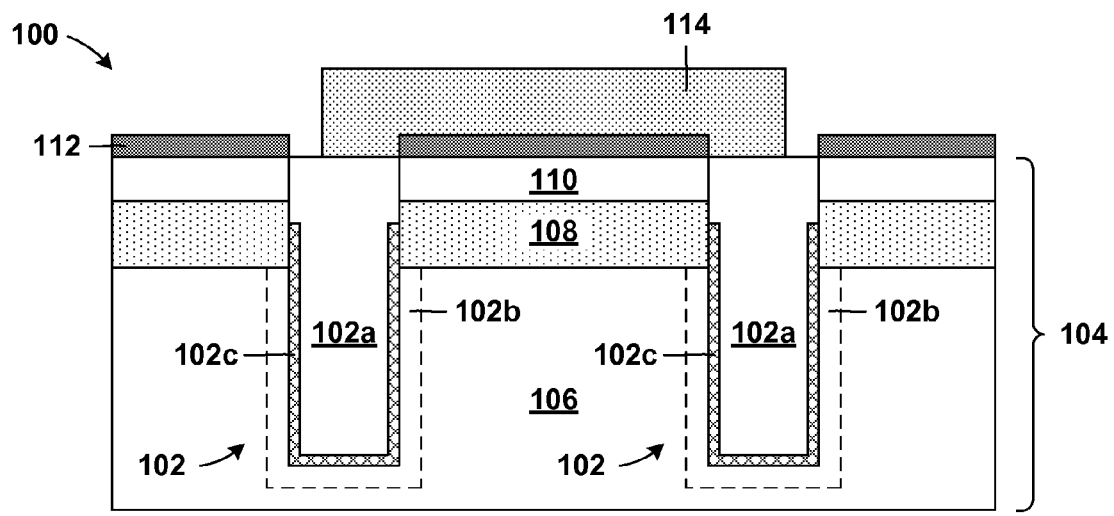
FIG. 1A is a cross section view of FIG. 1, taken along section line A-A.

Referring now to FIGS. 1 and 1A, a demonstrative illustration of a structure 100 is shown during an intermediate step of a method of forming a deep trench memory cell using a buffered sidewall image transfer (SIT) technique according to an embodiment. More specifically, the method may begin with forming deep trench capacitors 102 embedded in a substrate 104. FIG. 1 illustrates a cross section view of the structure 100. FIG. 1A is a cross section view of FIG. 1 taken along section line A-A.

The substrate 104 may include a bulk semiconductor or a layered semiconductor such as Si/SiGe, a silicon-on-insulator, or a SiGe-on-insulator. Bulk substrate materials may include undoped Si, n-doped Si, p-doped Si, single crystal Si, polycrystalline Si, amorphous Si, Ge, SiGe, SiC, SiGeC, Ga, GaAs, InAs, InP and all other III/V or II/VI compound semiconductors. A semiconductor-on-insulator (SOI) substrate is illustrated in the figures and is relied upon for the corresponding discussion. The SOI substrate 104 of the present example includes a base substrate 106, a buried insulator layer 108, and a top semiconductor layer 110.

The base substrate 106 may be made from any of several known semiconductor materials such as, for example, a bulk silicon substrate. Other non-limiting examples include silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide. Typically the base substrate 106 may be about, but is not limited to, several hundred microns thick. For example, the base substrate 106 may include a thickness ranging from 0.5 mm to about 1.5 mm, and ranges there between.

The buried insulator layer 108 may be formed from any of several dielectric materials. Non-limiting examples include, for example, oxides, nitrides and oxynitrides of silicon. Oxides, nitrides and oxynitrides of other elements are also envisioned. In addition, the buried insulator layer 108 may include crystalline or non-crystalline dielectric material. Moreover, the buried insulator layer 108 may be formed using any of several methods. Non-limiting examples include ion implantation methods, thermal or plasma oxidation or nitridation methods, chemical vapor deposition methods and physical vapor deposition methods. In one embodiment, the buried insulator layer 108 may be about 200 nm thick. Alternatively, the buried insulator layer 108 may include a thickness ranging from about 10 nm to about 500 nm, and ranges there between.

The top semiconductor layer 110 may include any of the several semiconductor materials included in the base substrate 106. In general, the base substrate 106 and the top semiconductor layer 110 may include either identical or different semiconducting materials with respect to chemical composition, dopant concentration and crystallographic orientation. In one particular embodiment of the present invention, the base substrate 106 and the top semiconductor layer 110 include semiconducting materials that include at least different crystallographic orientations. Typically the base substrate 106 or the top semiconductor layer 110 include a {110} crystallographic orientation and the other of the base substrate 106 or the top semiconductor layer 110 includes a {100} crystallographic orientation. Typically, the top semiconductor layer 110 includes a thickness ranging from about 5 nm to about 100 nm, and ranges there between. Methods for making the top semiconductor layer 110 are well known in the art. Non-limiting examples include SIMOX (Separation by Implantation of Oxygen), wafer bonding, and ELTRAN® (Epitaxial Layer TRANsfer).

First, a first pad layer 112 may be deposited on top of the substrate 104. The first pad layer 112 may include a dielectric material suitable for use as a hardmask, such as, for example, a nitride. In an embodiment, the first pad layer 112 may include silicon nitride, which may be formed using conventional deposition methods, for example, chemical vapor deposition, such as for example, low pressure chemical vapor deposition (LPCVD), rapid thermal chemical vapor deposition (RTCVD), plasma enhanced chemical vapor deposition (PECVD), and high density plasma chemical vapor deposition (HDPCVD), sputtering, or other like deposition techniques. The first pad layer 112 may be used to subsequently pattern the deep trench capacitors 102 according to known techniques. The term "deep trench" denotes a trench formed in a semiconductor substrate having a sufficient depth to form a capacitor. As such, a deep trench may typically denote a trench having a depth equal to or greater than 1 micron, whereas a shallow trench may typically refer to a trench having a depth less than 1 micron. While the present embodiment may be described with a deep trench, the present embodiment may be employed with a trench having any depth into the substrate 104. Such variations are explicitly contemplated herein.

Formation of the deep trench capacitors 102 may begin by patterning the first pad layer 112 and transferring the pattern into the substrate 104 to form deep trenches. The deep trenches may be patterned in the substrate 104 by applying a photoresist (not shown) to an upper surface of the first pad layer 112, exposing the photoresist to a desired pattern of radiation and developing the exposed photoresist utilizing a conventional resist developer. The pattern in the photoresist may then be transferred to the first pad layer 112 and the substrate 104 using one or more dry etching techniques. Suitable dry etching techniques may include, but are not limited to: reactive ion etching (RIE), ion beam etching, plasma etching, or laser ablation. For the clarity, the first pad layer 112 is shown as a single layer. However, in some embodiments, the first pad layer 112 may include multiple layers of different materials to allow deeper trench formation. In an embodiment, inorganic or organic layers can be added beneath the photo resist and above the pad layer to assist with patterning small features.

After etching, the deep trenches may then be filled to form the deep trench capacitors 102. In an embodiment, the fill material may include one or more layers and may include any combination of dielectric, semi-conductive, or conductive materials common to the fabrication of a deep trench memory cell, or more specifically a deep trench capacitor. For example, the fill material may include an inner electrode 102a and an outer electrode 102b separated by a node dielectric layer 102c. The outer electrode 102b may include a portion of the substrate 104 within the deep trench which may have been doped to form a buried plate. In general, the inner electrode 102a and outer electrode 102b may include conductive or semi-conductive materials, such as, for example, metals or silicon. In an embodiment, for example, the inner electrode 102a of the deep trench capacitors 102 may be heavily doped polysilicon or a combination of doped polysilicon and metallic nitride to reduce electrode resistance.

In an embodiment, the inner electrode 102a may be recessed to a height at or below a bottom of the first pad layer 112. In the present example, the inner electrode 102a is preferably recessed such that a top of the inner electrode 102a is substantially flush with a top of the substrate 104. Stated differently, the inner electrode 102a may be recessed such that a top surface of the inner electrode 102a is substantially coplanar with a top surface of the substrate 104. Next, a masking layer, such as a photoresist, may be deposited and patterned to form a strap mask 114. The strap mask 114 may be used to subsequently form a strap at the top of the deep trench capacitor 102. The strap mask 114 may include any known masking material suitable to pattern the inner electrode 102a of the deep trench capacitor 102, as described below.

Figure 2:
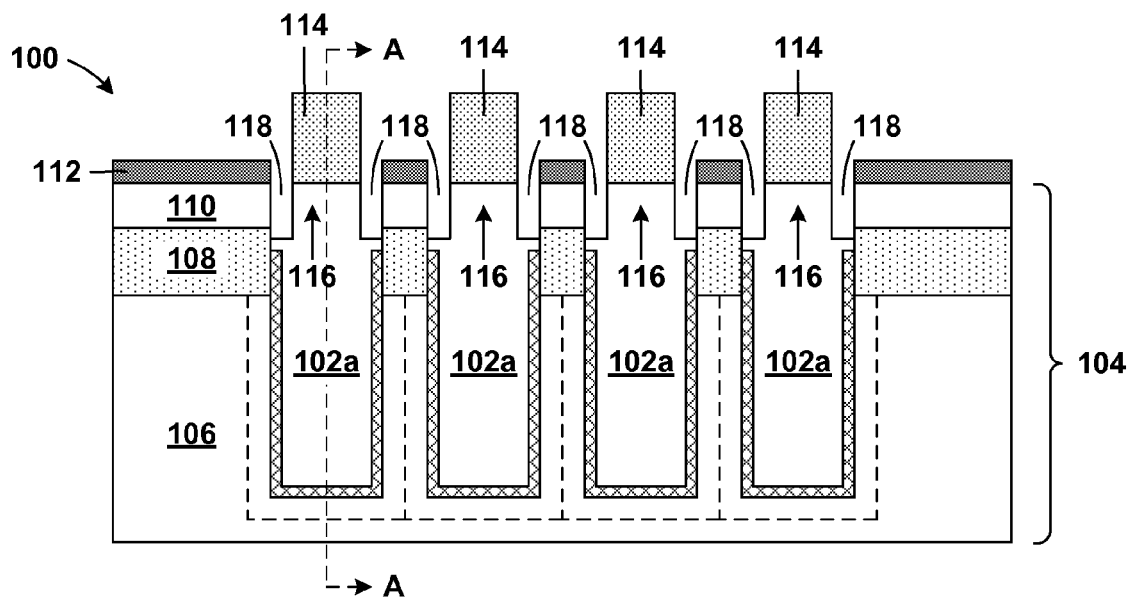
FIG. 2 illustrates transferring the pattern of the strap mask into an inner electrode of the deep trench capacitors to define straps bordered on three sides by a trench according to an exemplary embodiment.
Figure 2A:
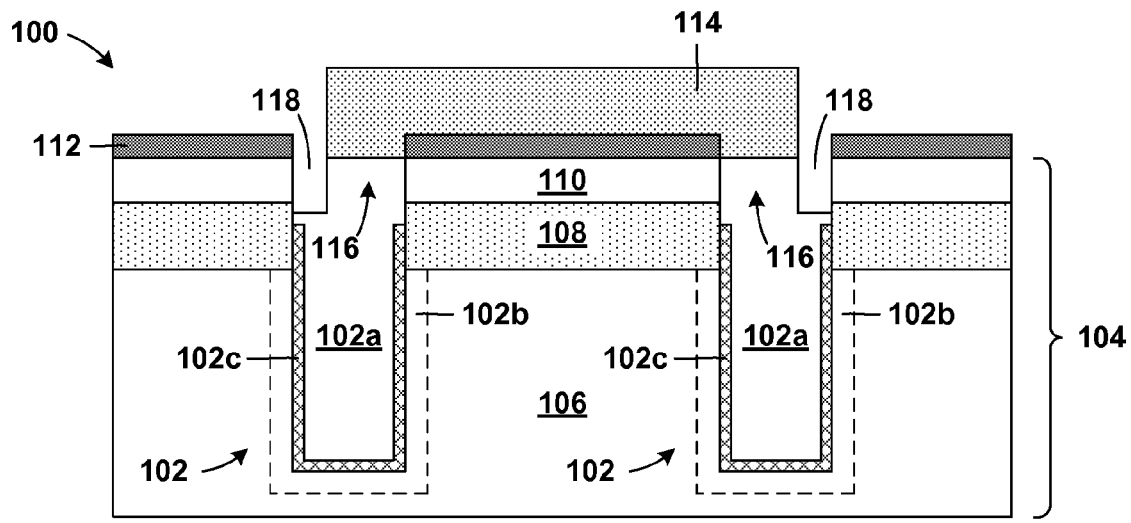
FIG. 2A is a cross section view of FIG. 2, taken along section line A-A.

Referring now to FIGS. 2 and 2A, a demonstrative illustration of the structure 100 is shown during an intermediate step of the method of forming the deep trench memory cell using the buffered sidewall image transfer (SIT) technique according to an embodiment. More specifically, the method may include transferring the pattern of the strap mask 114 into the inner electrode 102a of the deep trench capacitors 102 to define the strap 116 bordered by a trench 118 and a portion of the semiconductor layer 110. FIG. 2 illustrates a cross section view of the structure 100. FIG. 2A is a cross section view of FIG. 2 taken along section line A-A. Any suitable etching technique may be used to etch a portion of the inner electrode 102a selective to the strap mask 114 and the first pad layer 112. The top semiconductor layer 110 and the buried insulator layer 108 are protected by the first pad layer 112, as shown. For example, a directional etching technique such as a reactive ion etching technique may be used to etch or recess the portion of the inner electrode 102a forming a strap 116 bordered on three sides by the trench 118. The strap 116 includes a conductive portion of the fill material, typically a portion of the inner electrode 102a, extending from a top of the deep trench capacitor 102 and is subsequently directly connected to a source-drain region (to be located in the semiconductor layer 110) of a semiconductor device.

It should be noted that in embodiments in which the inner electrode 102a of the deep trench capacitors 102 includes polysilicon care should be taken to limit any etching of the top semiconductor layer 110, which may also be silicon based, and susceptible to the desired etching technique. For this reason, a dry etching technique or a directional etching technique is preferable. The trench 118 should preferably extend to a depth below a top surface of the buried insulator layer 108 such that the only portion of the deep trench capacitor 102 remaining above at least a top portion of the buried insulator layer 108 is the strap 116.

Figure 3:
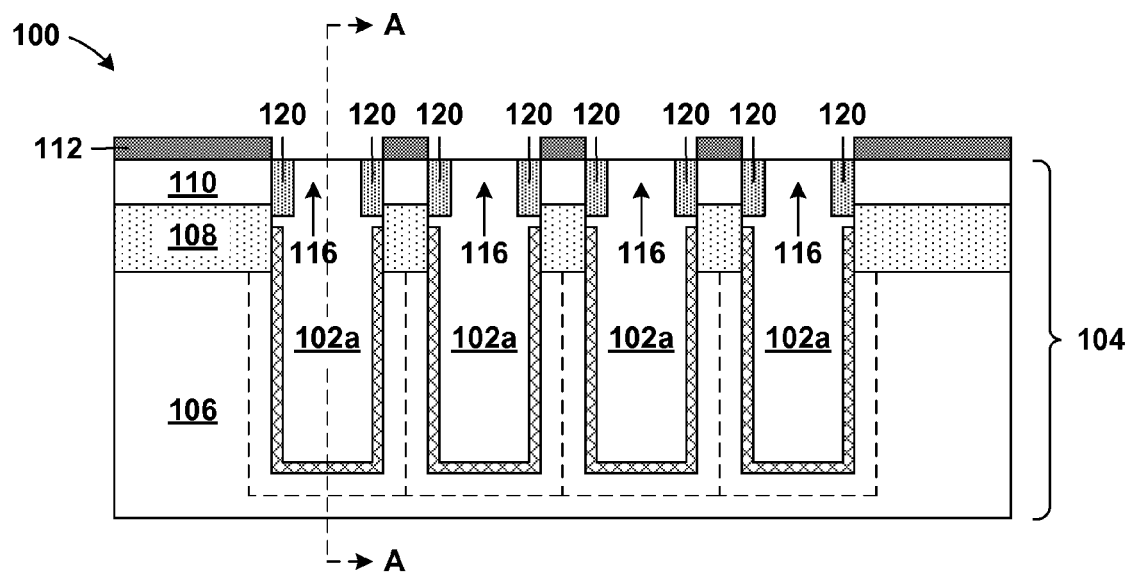
FIG. 3 illustrates removing the strap mask and filling the trench with a dielectric material according to an exemplary embodiment.
Figure 3A:
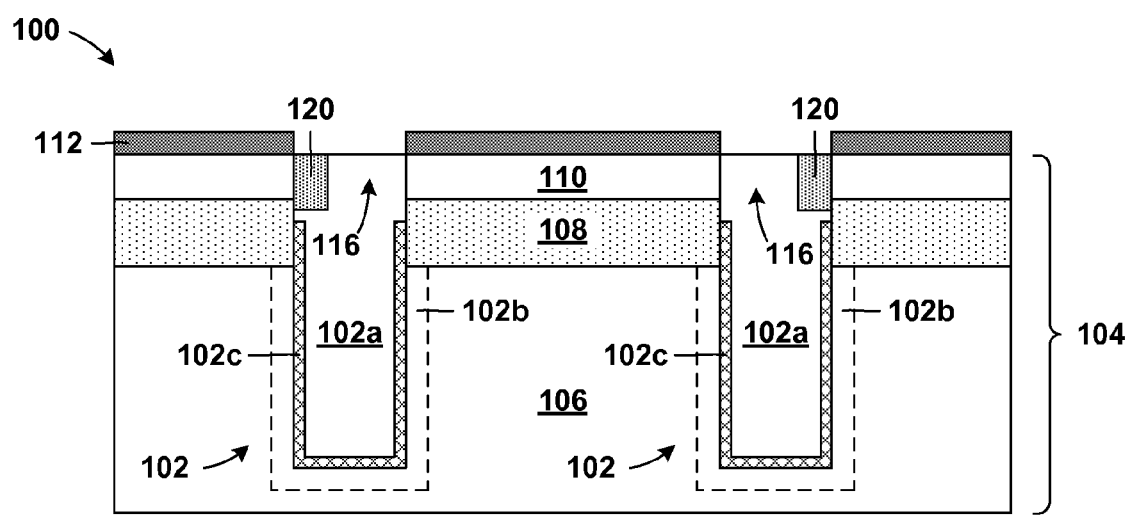
FIG. 3A is a cross section view of FIG. 3, taken along section line A-A.
Figure 3B:
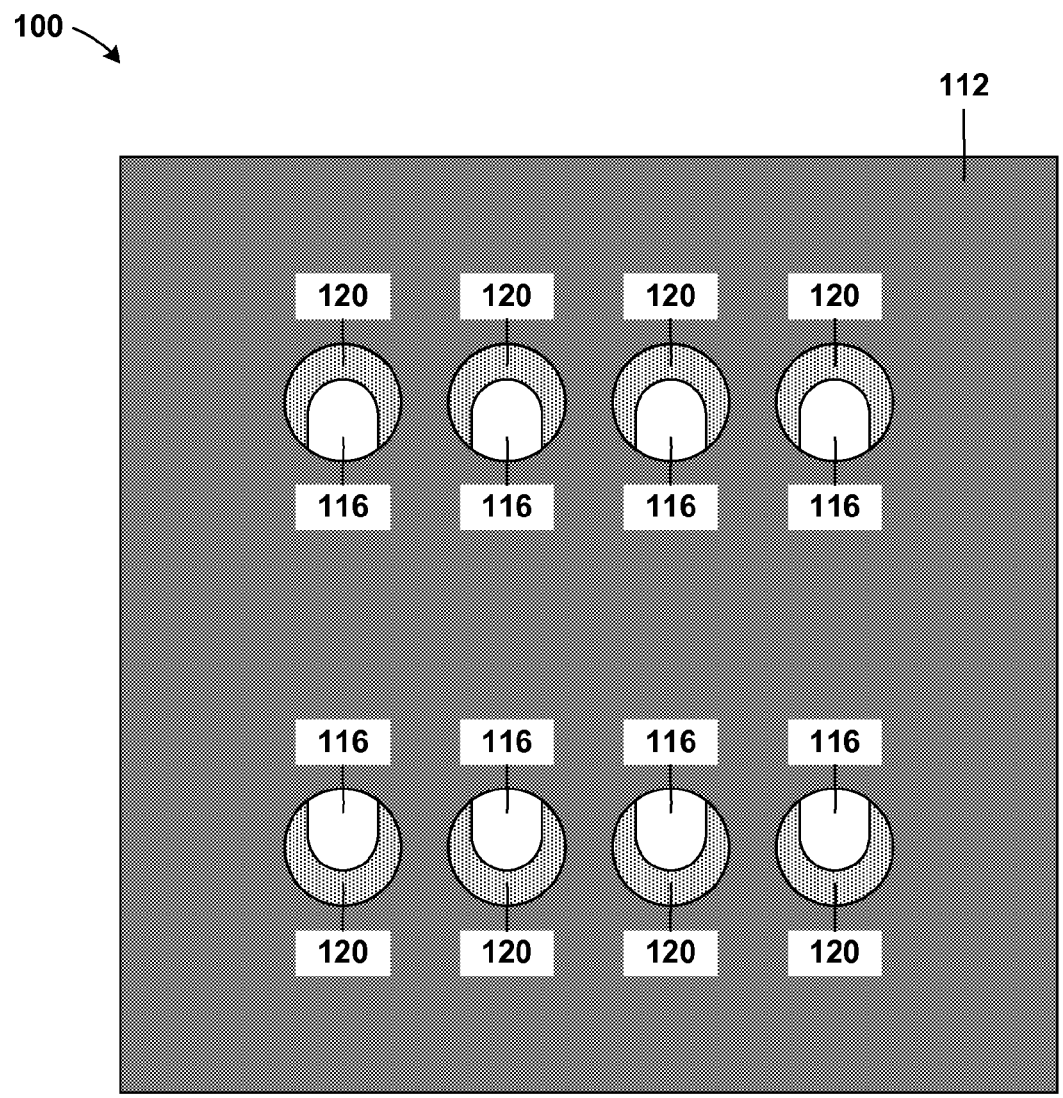
FIG. 3B is a top view of FIG. 3.

Referring now to FIGS. 3, 3A, and 3B, a demonstrative illustration of the structure 100 is shown during an intermediate step of the method of forming the deep trench memory cell using the buffered sidewall image transfer (SIT) technique according to an embodiment. More specifically, the method may include removing the strap mask 114 and filling the trench 118 with a dielectric material 120. FIG. 3 illustrates a cross section view of the structure 100. FIG. 3A is a cross section view of FIG. 3 taken along section line A-A. FIG. 3B is a top view of the structure 100.

Before filling the trench 118 with the dielectric material 120, the strap mask 114 may preferably be stripped or removed using known resist stripping techniques. The dielectric material 120 may then be deposited across the top of the structure 100 in a blanket layer using any known deposition technique, such as, for example, chemical vapor deposition, atomic layer deposition, physical layer deposition, or some combination thereof. More specifically, the dielectric material 120 may be deposited directly within the trench 118, on top of the inner electrode 102a of the deep trench capacitors 102, and on top of the first pad layer 112. The dielectric material 120 may include materials, such as, for example, an oxide, a nitride, or some combination thereof. In an embodiment, the dielectric material may include an oxide, such as, silicon oxide. A chemical mechanical polishing technique may optionally be used to polish the dielectric material 120, and provide a substantially smooth and uniform surface. After deposition, and polishing, if applicable, the dielectric material 120 may preferably be etched back below the top surface of the first pad layer 112. The dielectric material 120 may be etched back or recessed selective to the first pad layer 112 and the inner electrode 102a of the deep trench capacitors 102 using known wet etching techniques, such as, for example CF containing dry etching or HF containing wet solution in instances when a chemical mechanical polish was used to achieve a smoother and more uniform surface The dielectric material 120 may preferably be etched back or recessed to about the top surface of the top semiconductor layer 110, as shown in the figures. The dielectric material 120 forms a horseshoe shaped insulator around the strap 116, as illustrated in FIG. 3B. The dielectric material 120 may alternatively be referred to as a dielectric collar.

Figure 4:
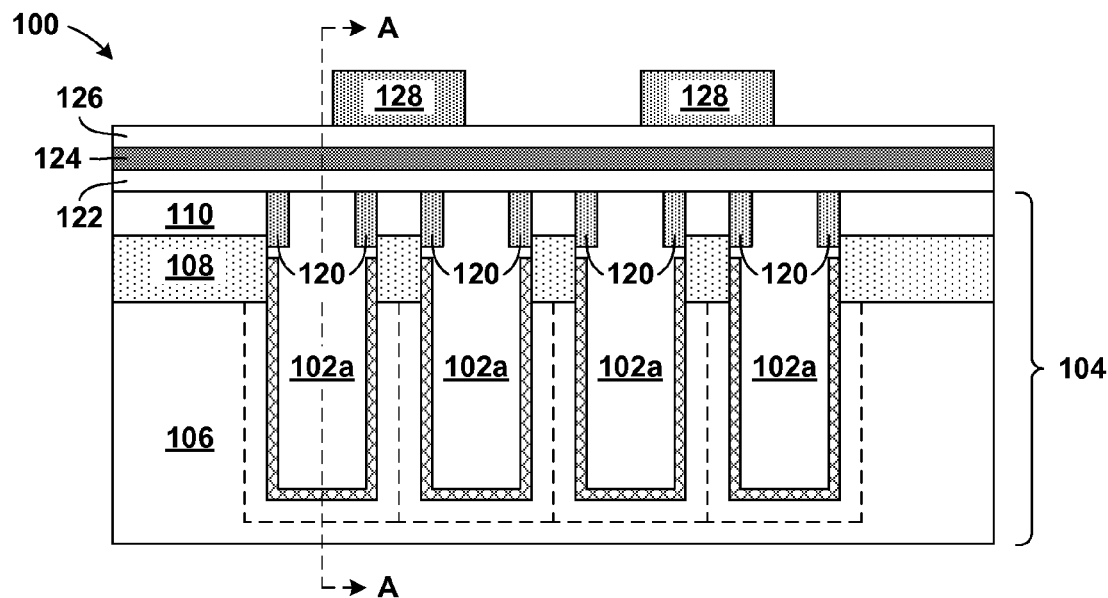
FIG. 4 illustrates stripping or removing a first pad layer from above the substrate followed by forming a second pad layer, a buffer layer, and a third pad layer, all above the substrate, followed by forming a mandrel on top of the third pad layer according to an exemplary embodiment.
Figure 4A:
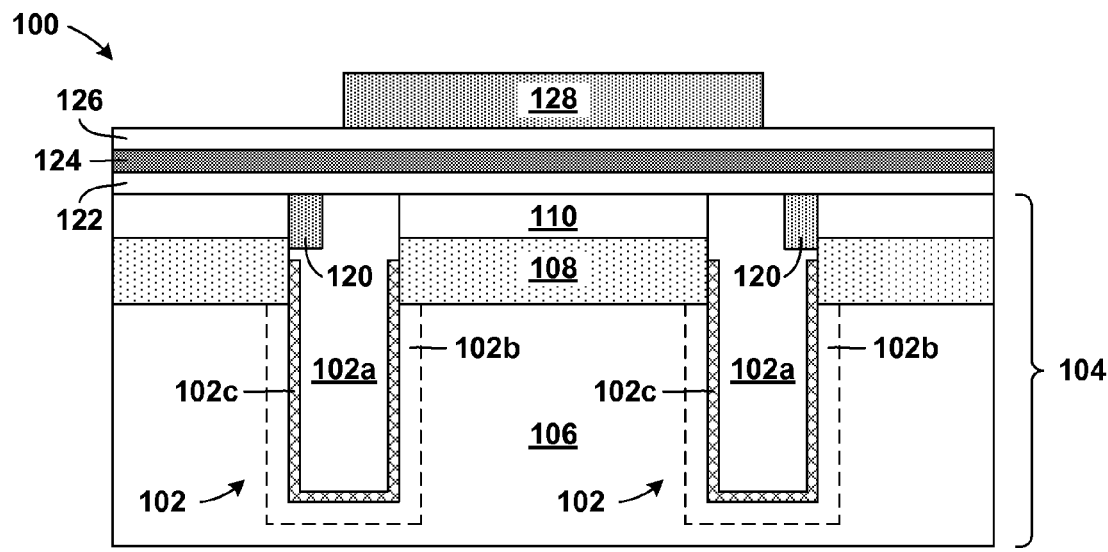
FIG. 4A is a cross section view of FIG. 4, taken along section line A-A.

Referring now to FIGS. 4 and 4A, a demonstrative illustration of the structure 100 is shown during an intermediate step of the method of forming the deep trench memory cell using the buffered sidewall image transfer (SIT) technique according to an embodiment. More specifically, the method may include stripping or removing the first pad layer 112 followed by forming a second pad layer 122, a buffer layer 124, and a third pad layer 126, all above the substrate 104, and forming a mandrel 128 on top of the third pad layer 126. FIG. 4 illustrates a cross section view of the structure 100. FIG. 4A is a cross section view of FIG. 4 taken along section line A-A. First, the first pad layer 112 may be stripped or removed using known techniques, such as, for example, hot phosphoric acid solution. Next, the second pad layer 122, the buffer layer 124, and the third pad layer 126 may be deposited consecutively on top of the structure 100 and specifically on top of the top semiconductor layer 110 and the deep trench capacitors 102.

The second pad layer 122 may include an insulating material such as, for example, silicon oxide. The second pad layer 122 may be formed using conventional deposition methods, for example, chemical vapor deposition, such as for example, chemical vapor deposition, physical vapor deposition, atomic vapor deposition, sputtering, or other like deposition techniques. The second pad layer 122 may have a thickness ranging from about 2 nm to about 4 nm, and ranges there between.

The buffer layer 124 may include any material that which may have an etch rate sufficiently different from either the second pad layer 122 or the third pad layer 126. A sufficiently different etch rate may be one that allows the third pad layer 126 to be removed selective to the buffer layer 124 and allows the buffer layer 124 to be removed selective to the second pad layer 122. In an embodiment, the buffer layer 124 may be made from amorphous silicon. The buffer layer 124 may be formed using conventional deposition methods, for example, chemical vapor deposition, such as for example, chemical vapor deposition, physical vapor deposition, atomic vapor deposition, sputtering, or other like deposition techniques. The buffer layer 124 may have a thickness ranging from about 10 nm to about 40 nm, and ranges there between.

The third pad layer 126 may include an insulating material such as, for example, silicon nitride. In an embodiment, the third pad layer 126 may be substantially similar in all respects to the second pad layer 122. The third pad layer 126 may be formed using conventional deposition methods, for example, chemical vapor deposition, such as for example, chemical vapor deposition, such as for example, chemical vapor deposition, physical vapor deposition, atomic vapor deposition, sputtering, or other like deposition techniques. The third pad layer 126 may have a thickness ranging from about 20 nm to about 50 nm, and ranges there between. In the present example, the second pad layer 122 and the third pad layer 126 may alternatively be referred to as a bottom pad layer and a top pad layer, respectively.

The second pad layer 122, the buffer layer 124, and the third pad layer 126 will provide a desired etch selectivity for subsequent processing as will be described in further detail below. In general, the thickness of each must be sufficient to provide the desired etch selectivity.

The mandrel 128 can be formed directly on top of the third pad layer 126 using known photolithography and masking techniques. During this step, a mandrel layer can be formed on top of the third pad layer 126. The mandrel layer can include amorphous silicon or any silicon based compound, for example, silicon nitride, silicon oxide, or silicon carbon, or alternatively amorphous carbon. The mandrel layer may preferably include a material that is different enough from the material of the sidewall spacers (described below) and the material of the third pad layer 126 so that it can be selectively removed. The particular material chosen can partly depend upon the desired pattern to be formed and the other materials chosen in subsequent steps discussed below. In an embodiment, the mandrel layer can be formed with a vertical thickness ranging from about 30 nm to about 150 nm, and ranges there between. The mandrel layer can then be lithographically patterned to create the mandrel 128. The mandrel 128 can be formed by applying known patterning techniques involving exposing a photoresist and transferring the exposed pattern of the photoresist by etching the mandrel layer. It should be noted that the mandrel 128 may be patterned into any shape and any size necessary to subsequently produce a desired device pattern, as will be described in more detail below.

Figure 5:
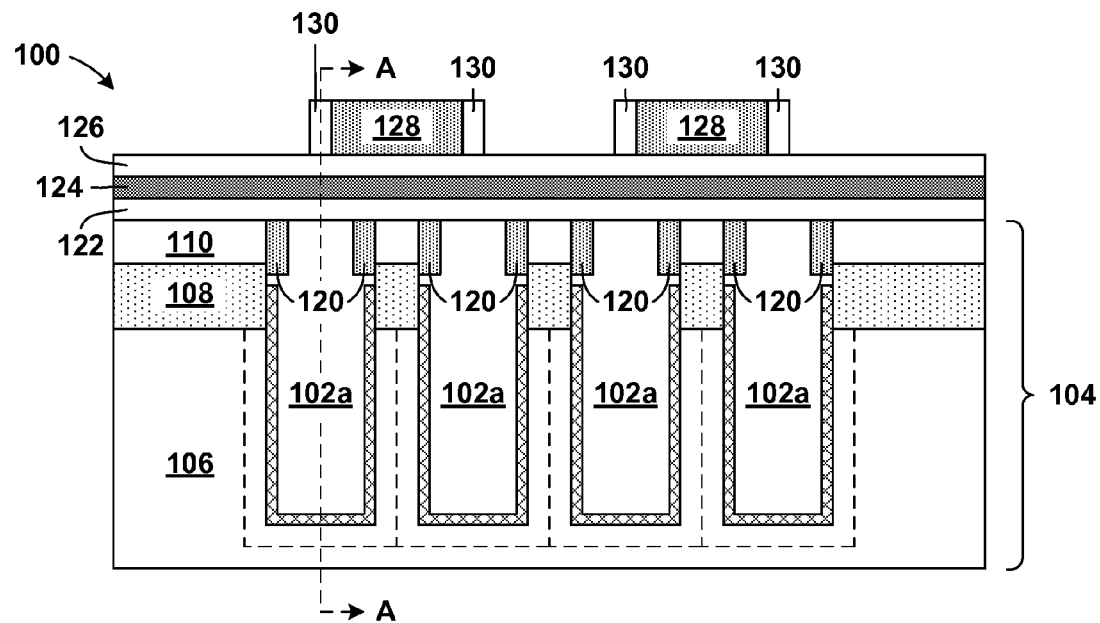
FIG. 5 illustrates forming sidewall spacers on opposite sidewalls of the mandrel according to an exemplary embodiment.
Figure 5A:
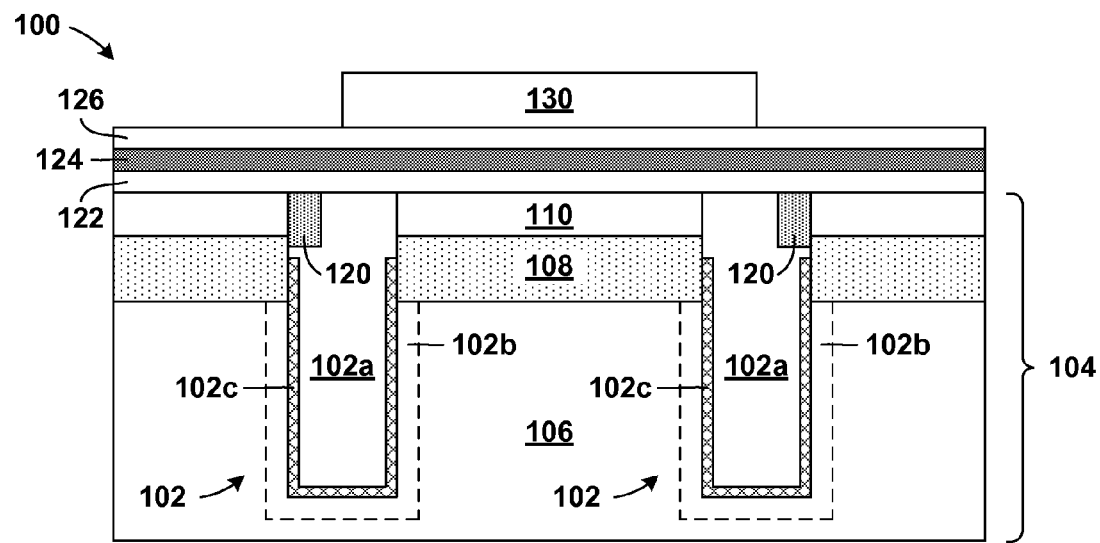
FIG. 5A is a cross section view of FIG. 5, taken along section line A-A.

Referring now to FIGS. 5 and 5A, a demonstrative illustration of the structure 100 is shown during an intermediate step of a method of concurrently forming the deep trench memory cell using the buffered sidewall image transfer (SIT) technique according to an embodiment. More specifically, the method can include forming sidewall spacers 130 on opposite sidewalls of the mandrel 128. FIG. 5 illustrates a cross section view of the structure 100. FIG. 5A is a cross section view of FIG. 5 taken along section line A-A.

First, a layer of dielectric material may be conformally deposited on top of the structure 100. Specifically, the layer of dielectric material may be deposited directly on the third pad layer 126 and covering the mandrel 128. In an embodiment, the layer of dielectric material can include, for example, silicon nitride or silicon oxide. It may be preferable, in some cases, to fabricate the sidewall spacers 130 from a material having a substantially different etch rate than that of the third pad layer 126 to effect good etch selectivity. In an embodiment, the layer of dielectric material may preferably include an oxide, for example, silicon oxide. The layer of dielectric material can be deposited with a conformal deposition technique, using any known atomic layer deposition technique, molecular layer deposition techniques, or other known conformal deposition techniques. In an embodiment, the layer of dielectric material can have a substantially conformal and uniform thickness ranging from about 5 nm to about 20 nm, and ranges there between.

Next, a directional anisotropic etching technique may be used to remove a portion of the layer of dielectric material from horizontal surfaces of the structure 100, while leaving it on the sidewalls of the mandrel 128. For example, a reactive-ion-etching technique may be used to remove portions of the layer of dielectric material from directly above the third pad layer 126 and from a top surface of the mandrel 128. The portion of the layer of dielectric material remaining along opposite sidewalls of the mandrel 128, form the sidewall spacers 130. Furthermore, the mandrel 128 and the sidewall spacers 130 should each include materials that would allow the mandrel 128 to be subsequently removed selective to the sidewall spacers 130. Here, it should also be noted that the sidewall spacers 130 depicted in the figures are for illustration purposes and generally can have a slightly different shape from those shown. For example, the sidewall spacers 130 can have rounded corners which may naturally form during the directional etching process as is known in the art.

The sidewall spacers 130 may have a lateral width ranging substantially equal to the conformal thickness of the layer of dielectric material above. In an embodiment, the lateral width of the sidewall spacers 130 may preferably be sublithographic, or smaller than a lithographic minimum dimension. The term "sublithographic" may refer to a dimension or size less than current dimensions achievable by photolithographic processes, and the term "lithographic" or "lithographic minimum dimension" may refer to a dimension or size equal to or greater than current dimensions achievable by photolithographic processes. The sublithographic and lithographic dimensions may be determined by a person of ordinary skill in the art at the time the application is filed. While a "lithographic minimum dimension" and a "sublithographic dimension" are defined only in relation to a lithography tool and normally change from generation to generation of semiconductor technology, it is understood that the lithographic minimum dimension and the sublithographic dimension are to be defined in relation to the best performance of lithography tools available at the time of semiconductor manufacturing. As of 2015, the lithographic minimum dimension is about 20 nm and is expected to shrink in the future. In an embodiment, for example, the sidewall spacers 130 may have a lateral width ranging from about 5 nm to about 15 nm, and ranges there between. It is possible to adjust spacer width based on etch bias or loss of material during process to meet final technology target dimension. The sidewall spacers 130 define a fin pattern which may subsequently be transferred into underlying layers, including the top semiconductor layer 110 of the substrate 104 and the inner electrode 102a of the deep trench capacitors 102.

Figure 6:
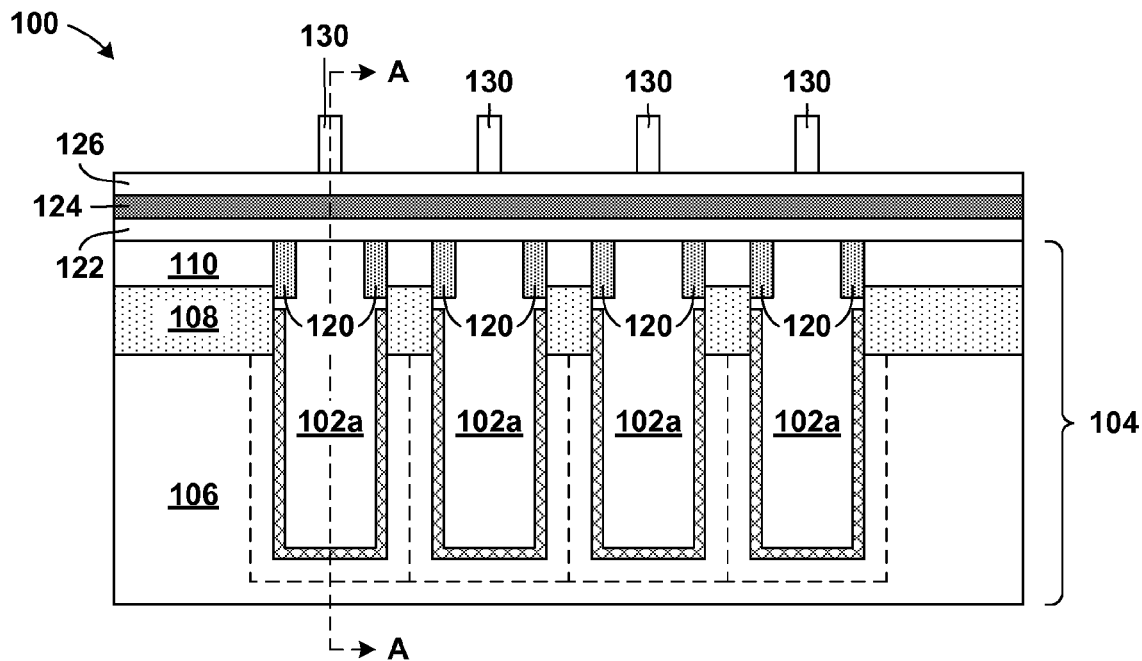
FIG. 6 illustrates removing the mandrel leaving a fin patterns made of the remaining sidewall spacers according to an exemplary embodiment.
Figure 6A:
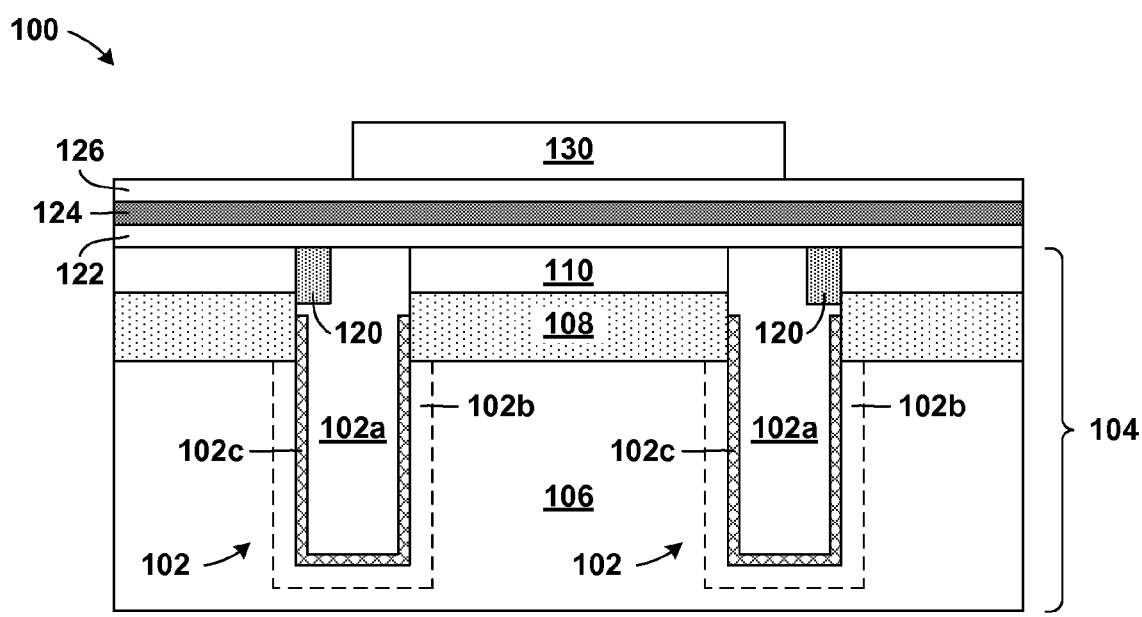
FIG. 6A is a cross section view of FIG. 6, taken along section line A-A.

Referring now to FIGS. 6 and 6A, a demonstrative illustration of the structure 100 is shown during an intermediate step of a method of concurrently forming the deep trench memory cell using the buffered sidewall image transfer (SIT) technique according to an embodiment. More specifically, the mandrel 128 may be removed selective to the sidewall spacers 130. FIG. 6 illustrates a cross section view of the structure 100. FIG. 6A is a cross section view of FIG. 6 taken along section line A-A.

First, a non-selective breakthrough etch may be applied to exposed the mandrel 128, if necessary. In an embodiment, the mandrel 128 is silicon, and the sidewall spacers 130 are an oxide. In such cases, the silicon may be removed selective to the oxide. Furthermore, the mandrel 128 be removed selective to the third pad layer 126. In an embodiment, the mandrel 128 can be removed using a typical dry etching including HBr in which the sidewall spacers 130 won't be trimmed or minimal loss.

Figure 7:
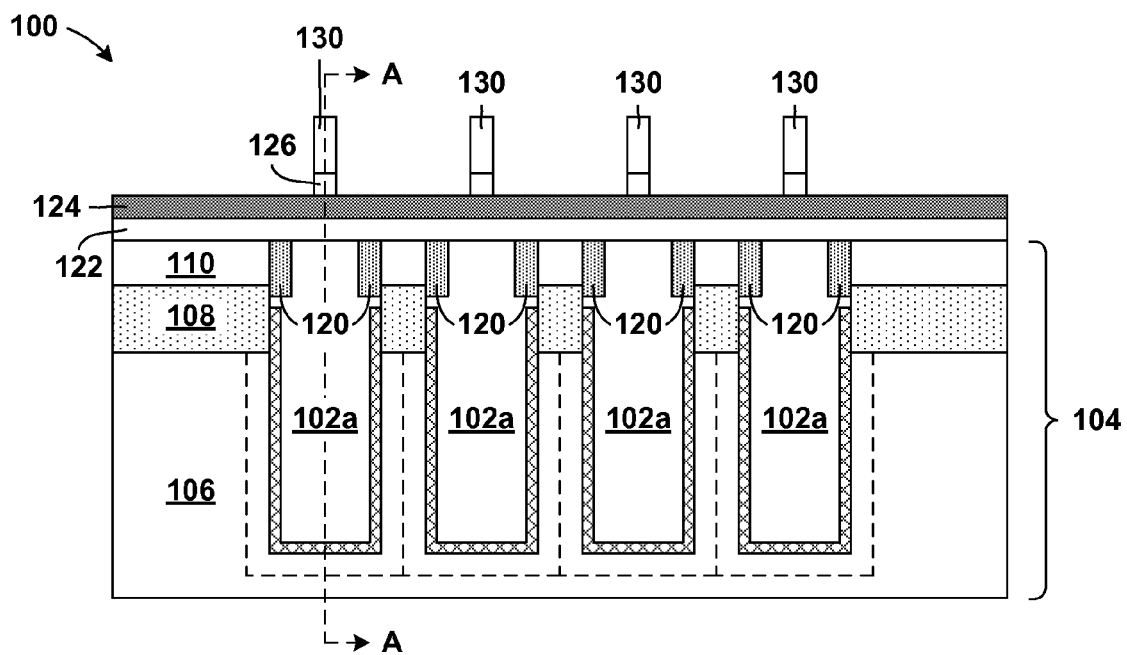
FIG. 7 illustrates transferring the fin pattern into the top pad layer according to an exemplary embodiment.
Figure 7A:
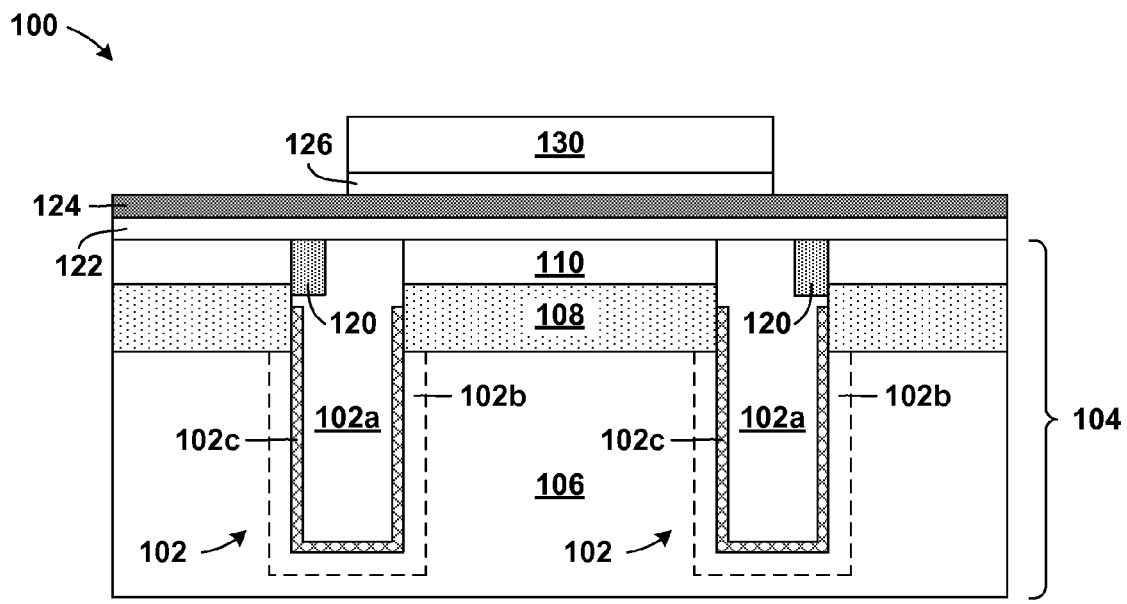
FIG. 7A is a cross section view of FIG. 7, taken along section line A-A.

Referring now to FIGS. 7 and 7A, a demonstrative illustration of the structure 100 is shown during an intermediate step of a method of concurrently forming the deep trench memory cell using the buffered sidewall image transfer (SIT) technique according to an embodiment. More specifically, a fin pattern defined by the sidewall spacers 130 may be transferred into the third pad layer 126 stopping on the buffer layer 124. FIG. 7 illustrates a cross section view of the structure 100. FIG. 7A is a cross section view of FIG. 7 taken along section line A-A.

First, the third pad layer 126 may be etched to expose the buffer layer 124. In doing so, the sidewall spacers 130 may simultaneously be lowered. A directional anisotropic etching technique such as a reactive-ion-etching technique can be used to etch the third pad layer 126. In an embodiment, where the third pad layer 126 is silicon nitride a reactive-ion-etching technique using a fluorocarbon based etchant with additional gases such as O2 or Ar may be used. In the present step, the sidewall spacers 130 can function as a mask, and can have high etch selectivity relative to the third pad layer 126.

Figure 8:
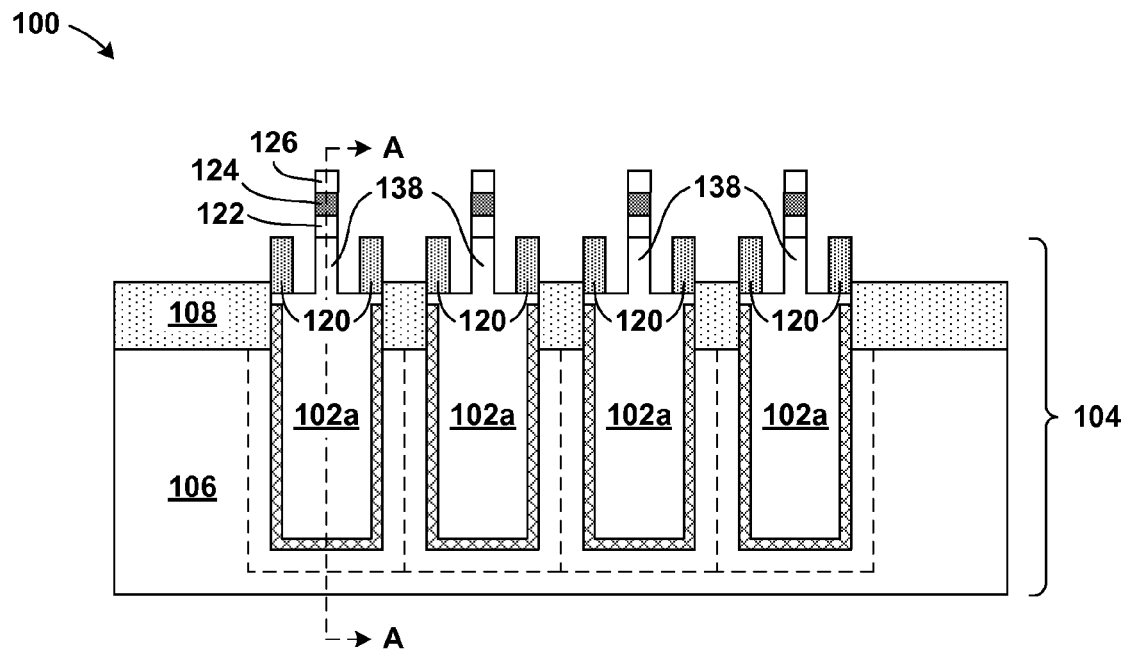
FIG. 8 illustrates transferring the fin pattern from the top pad layer into a top semiconductor layer and an inner electrode of the deep trench capacitor according to an exemplary embodiment.
Figure 8A:
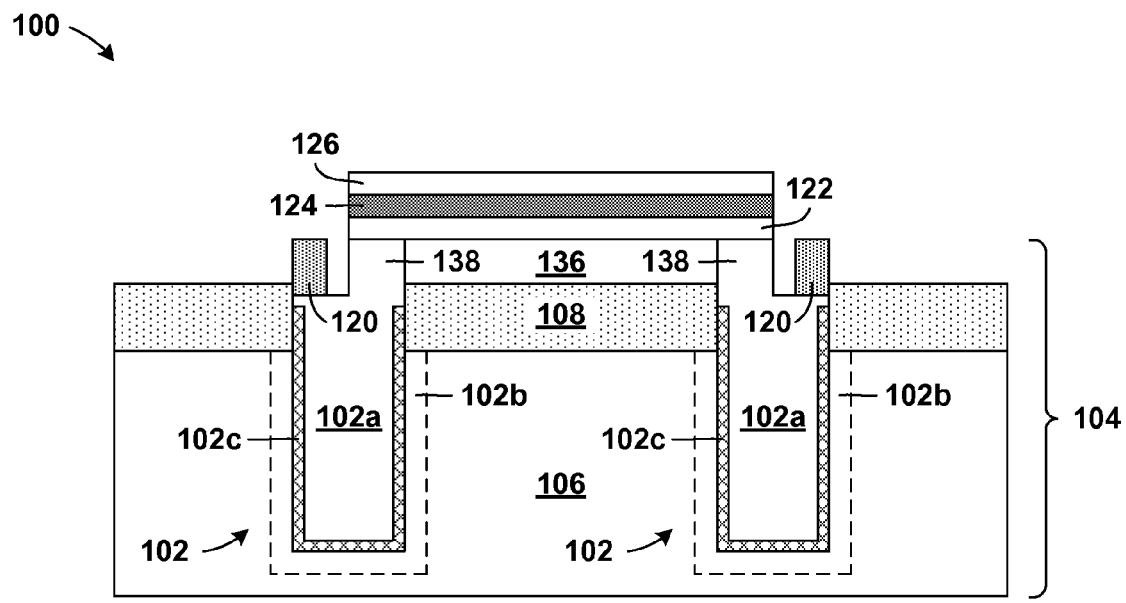
FIG. 8A is a cross section view of FIG. 8, taken along section line A-A.
Figure 8B:
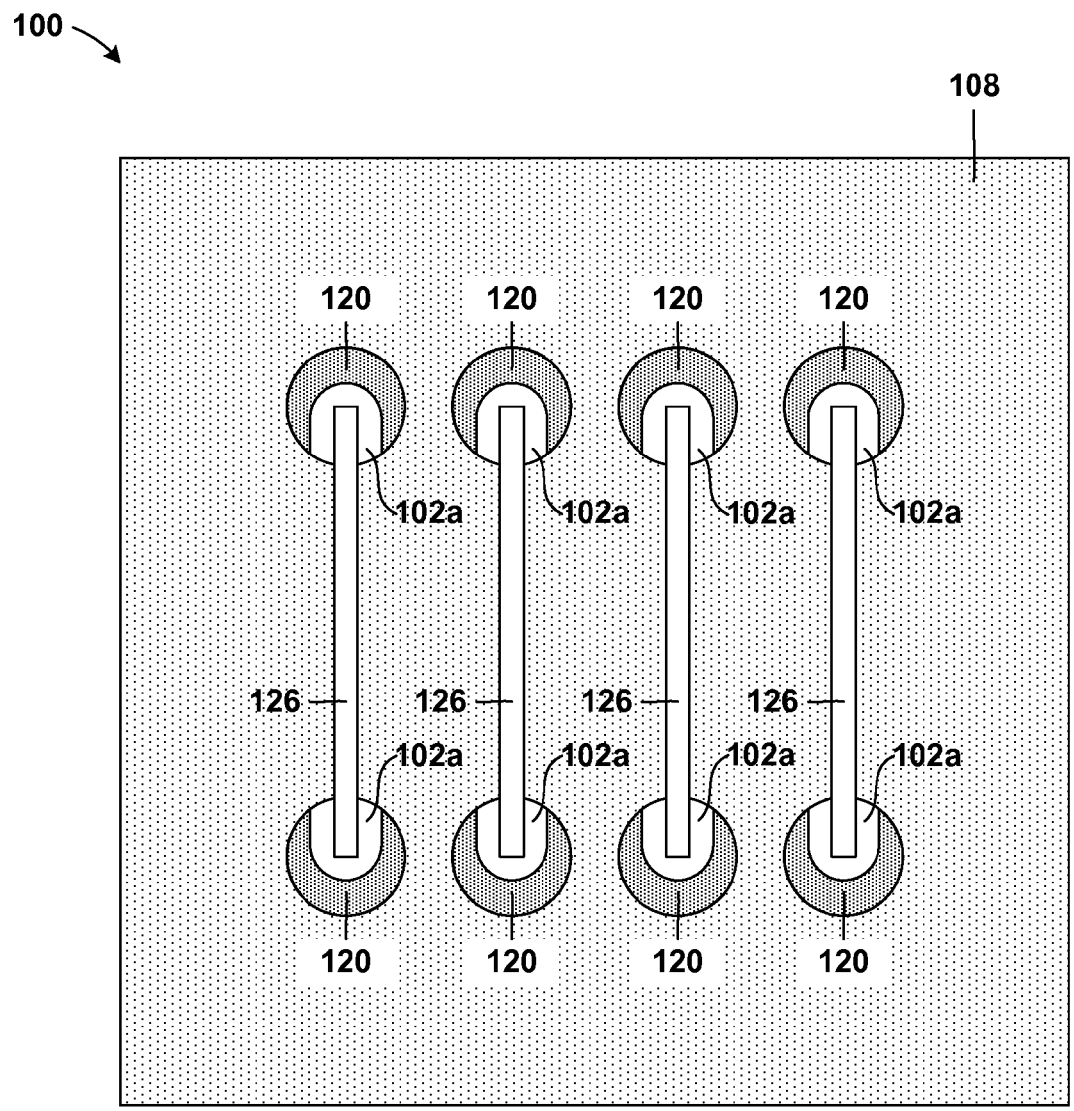
FIG. 8B is a top view of FIG. 8.

Referring now to FIGS. 8 and 8A, a demonstrative illustration of the structure 100 is shown during an intermediate step of a method of concurrently forming the deep trench memory cell using the buffered sidewall image transfer (SIT) technique according to an embodiment. More specifically, the sidewall spacers 130 may be removed, and the fin pattern may be transferred into the top semiconductor layer 110 of the substrate 104 and into the inner electrode 102a of the deep trench capacitors 102. Transfer of the fin pattern into a portion of the top semiconductor layer 110 creates a semiconductor fin 136 connecting two deep trench capacitors. In addition, the transfer of the fin pattern into the inner electrode 102 of the deep trench capacitors 102 may thin or etch the strap 116 resulting in a modified strap 138. FIG. 8 illustrates a cross section view of the structure 100. FIG. 8A is a cross section view of FIG. 8 taken along section line A-A. FIG. 8B is a top view of FIG. 8.

Figure 11:
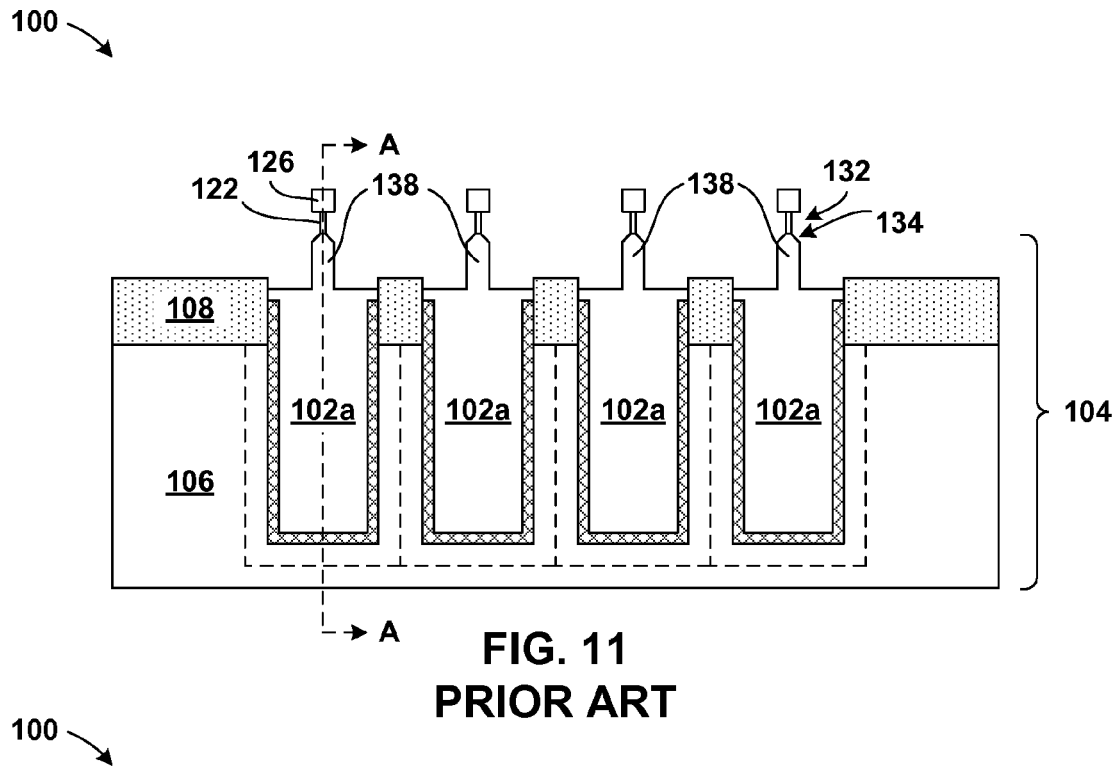
FIG. 11 illustrates an exemplary step in a semiconductor process flow according to the prior art.
Figure 11A:
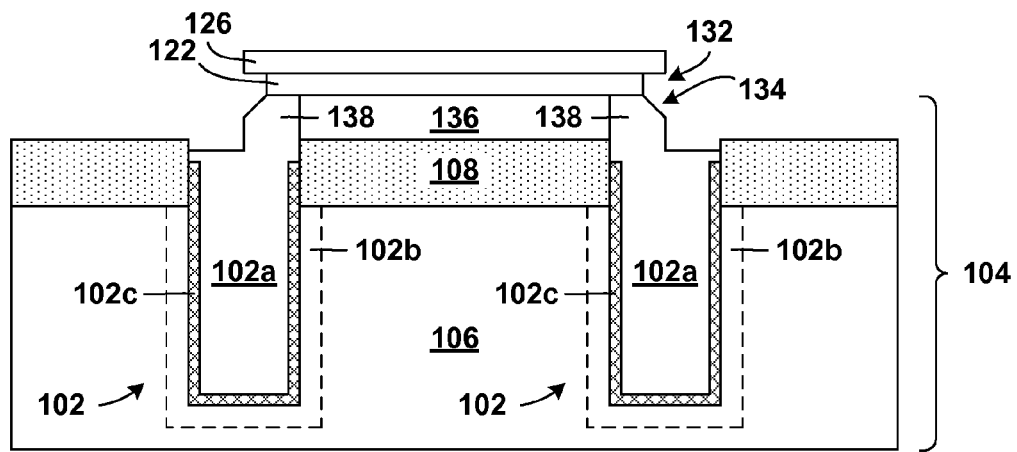
FIG. 11A is a cross section view of FIG. 11, taken along section line A-A.

First, the sidewall spacers 130 may be removed selective to the buffer layer 124 according to known techniques. In the present example, doing so will require etching oxides of the sidewall spacers 130 selective to silicon of the buffer layer 124. The buffer layer 124 protects the dielectric material 120 while the sidewall spacers 130 are etched and removed. This is one advantage or benefit resulting from the addition of the buffer layer 124. Also, with reference to FIGS. 11 and 11A, without the buffer layer 124, etching and removal of the sidewall spacers 130 may cause undercutting 132 in the second pad layer 122. More specifically, as the fin pattern is transferred from the third pad layer 126 into the second pad layer 122, without the buffer layer 124, a portion of the second pad layer 122 directly beneath the patterned portion of the third pad layer 126 will experience some undercutting 132. This undercutting 132 will cause degradation and damage 134 of portions of both the fin 136 and the modified strap 138 which remains unprotected by the second pad layer 122. The degradation and damage 134 of portions of both the fin 136 and the modified strap 138 will be detrimental to device performance and negativity affect device reliability. The buffer layer 124 (FIG. 8) allows for the fin 136 and the modified strap 138 to remain substantially protected by the second pad layer 122, as illustrated in FIGS. 8, 8A, thus virtually eliminating any risk of degradation or damage to the fin 136 and the modified strap 138. In addition, without the buffer layer 124, etching and removal of the sidewall spacers 130 may result in partial or complete removal of the dielectric material 120 (i.e. the dielectric collar).

Next, the top semiconductor layer 110 of the substrate 104 and the inner electrode 102a of the deep trench capacitors 102 may then be etched to a desired depth to form the fin 136 and the modified strap 138. The fin 136 includes a portion of the top semiconductor layer 110 and the modified strap 138 includes a remaining portion of the strap 116 (FIG. 2) after patterning and etching. The desired depth can depend on the ultimate function of the structure 100. In an embodiment, the top semiconductor layer 110 of the substrate 104 and the inner electrode 102a of the deep trench capacitors 102 may be etched to a depth sufficient to expose the buried insulator layer 108, as illustrated. Furthermore, the top semiconductor layer 110 of the substrate 104 and the inner electrode 102a of the deep trench capacitors 102 may preferably be etched selective to the dielectric material 120 of the deep trench capacitors 102.

A directional etching technique such as a reactive-ion-etching technique can be used to form the fin 136 and the modified strap 138. In an embodiment, the top semiconductor layer 110 of the substrate 104 and the inner electrode 102a of the deep trench capacitors 102 can be etched with a reactive-ion-etching technique using a chlorine or a bromine based etchant. In the present step, a combination of the third pad layer 126, the buffer layer 124, and the second pad layer 122 function as a mask, and can have high etch resistance to the particular etching technique(s) applied to etch the top semiconductor layer 110 of the substrate 104 and the inner electrode 102a of the deep trench capacitors 102. Finally, the third pad layer 126, the buffer layer 124, and the second pad layer 122 can be removed in subsequent steps using any suitable removal technique known in the art. It should be noted that a single fin 136 is etched from the top semiconductor layer 110 is in direct contact with and is aligned with the modified straps 138 of two adjacent deep trench capacitors 102. Stated differently, the fin 136 may extend between two modified straps of two adjacent deep trench capacitors 102.

It should be noted that the lateral thickness or width of the sidewall spacers 130 is dependent on the deposited thickness of the layer of dielectric material. Furthermore, the lateral thickness or width of the sidewall spacers 130 is directly related to a width of the fin 136. Therefore, the deposited thickness of the layer of dielectric material is directly related to a width of the fin 136.

Figure 9:
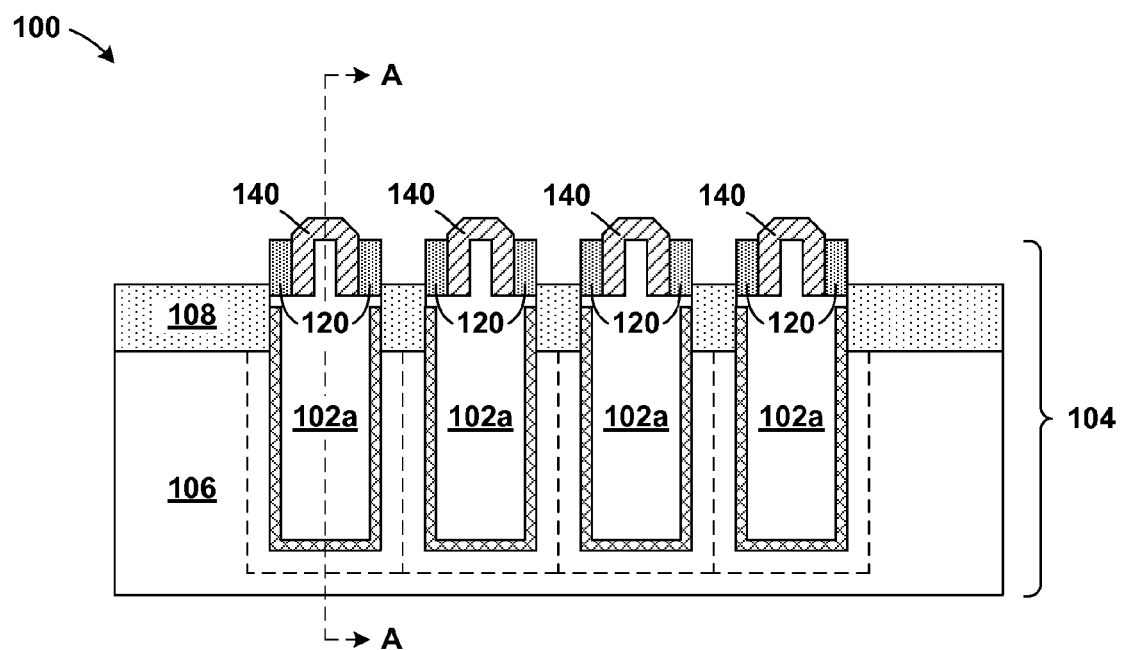
FIG. 9 illustrates growing epitaxy on exposed surfaces of a fin formed in the top semiconductor layer and on exposed surfaces of a modified strap formed in the inner electrode of the deep trench capacitor according to an exemplary embodiment.
Figure 9A:
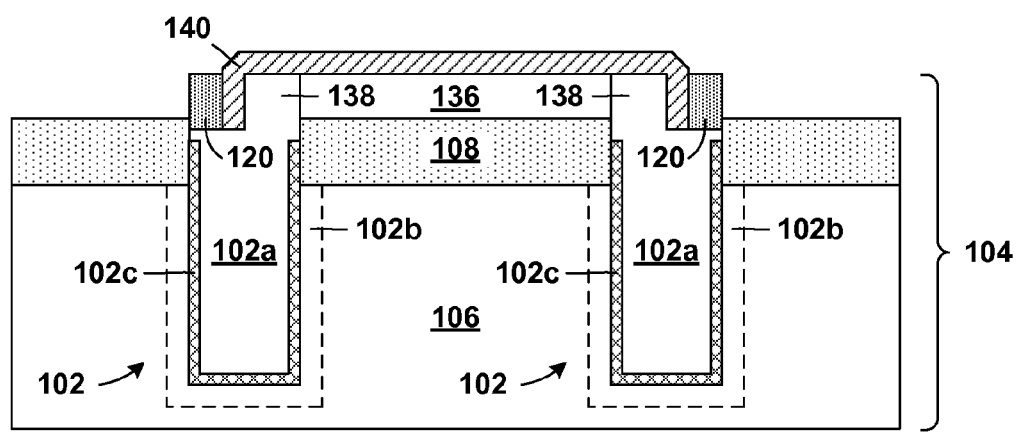
FIG. 9A is a cross section view of FIG. 9, taken along section line A-A.

Referring now to FIGS. 9 and 9A, a demonstrative illustration of the structure 100 is shown during an intermediate step of a method of concurrently forming the deep trench memory cell using the buffered sidewall image transfer (SIT) technique according to an embodiment. More specifically, epitaxy 140 may be grown on exposed surfaces of the fin 136 and the strap 138. FIG. 9 illustrates a cross section view of the structure 100. FIG. 9 illustrates a cross section view of the structure 100. FIG. 9A is a cross section view of FIG. 9 taken along section line A-A.

The epitaxy 140 may include, for example, silicon, germanium or some combination thereof. The epitaxy may be different for regions of the structure 100 containing p-type semiconductor devices than for regions of the structure 100 containing n-type semiconductor devices. In an embodiment, the epitaxy 140 may include silicon in-situ doped with p-type dopants or silicon germanium with a germanium content less than 40% wt, but greater than 10% wt. The epitaxy 140 may be grown on both the sidewalls and the top surfaces of the fin 136 and the strap 138. It should be noted that each strap 138 includes three sidewalls from which the epitaxy 140 will grow. Also, it should be noted that growth of the epitaxy 140 around the strap 138 will be limited or constrained by the dielectric material 120. The dielectric material 120 may prevent or limit epi over growth and further prevent epi short between trenches. Also, the dielectric material 120 may allow over growth in other non-DRAM areas of the structure 100 while limiting epi growth in DRAM areas of the structure 100, as illustrated. The epitaxy 140 may be grown by any means known in the art. For example, the epitaxy 140 may be grown at or around 800° C., and may be doped in-situ with a dopant.

Figure 10:
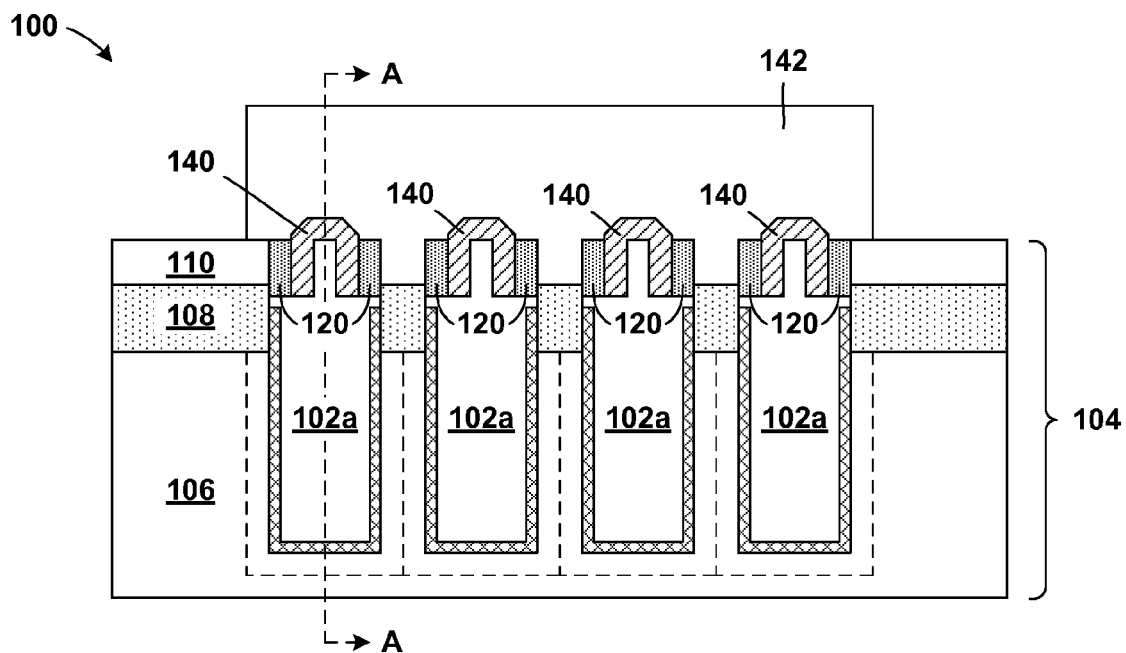
FIG. 10 illustrates forming a gate across a center portion of the fin according to an exemplary embodiment.
Figure 10A:
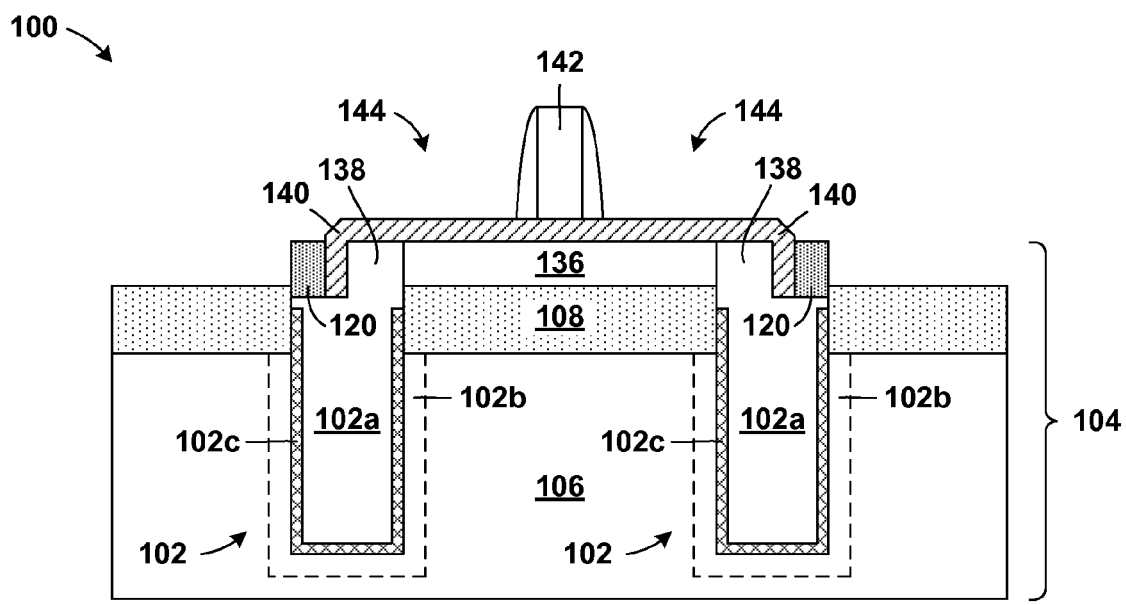
FIG. 10A is a cross section view of FIG. 10, taken along section line A-A.

Standard processing techniques may be used to complete fabrication of the deep trench memory cell, including, but not limited to, forming a gate 142 perpendicular to and across a center portion of the fin 136, as is shown, for example, in FIGS. 10 and 10A. Portions of the fin 136 on opposite sides of the gate may generally be referred to as source-drain regions 144 which are directly connected to the deep trench capacitor 102. In some embodiments, the gate may be formed in direct contact with the fin 136 prior to growing the epitaxy 140.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:
   forming a buffer layer between a top pad layer and a bottom pad layer, the bottom pad layer being on top of a deep trench capacitor embedded in a substrate;
   forming a fin pattern above the top pad layer using a sidewall image transfer technique, the fin pattern is defined by one or more sidewall spacers, such that at least one of the one or more sidewall spacers is directly above and aligned with at least a portion of the deep trench capacitor;
   transferring the fin pattern into the top pad layer stopping of the buffer layer; and
   forming a fin in direct contact with a strap by transferring the fin pattern into the buffer layer, into the bottom pad layer, and into the substrate and an inner electrode of the deep trench capacitor, the fin is formed from a portion of the substrate and the strap is formed from a portion of an inner electrode of the deep trench capacitor.

2. The method of claim 1, wherein the buffer layer is made from amorphous silicon.

3. The method of claim 1, wherein a lateral width of the one or more sidewall spacers is sublithographic.

4. The method of claim 1, wherein transferring the fin pattern into the top pad layer comprises:
   removing a portion of the top pad layer exposing an upper surface of the buffer layer such that another portion of the top pad layer remains directly beneath the one or more sidewall spacers.

5. The method of claim 1, wherein transferring the fin pattern into the top pad layer comprises:
   etching the top pad layer selective to the buffer layer using an anisotropic dry etching technique such that a portion of the top pad layer remains directly beneath the one or more sidewall spacers.

6. The method of claim 1, further comprising:
   forming a gate electrode perpendicular to and covering top and both sides of the fin.

7. The method of claim 1, further comprising:
   growing epitaxy on exposed sidewalls and exposed top surfaces of both the fin and the strap.

8. A method comprising:
   forming a deep trench capacitor embedded in a semiconductor-on-insulator substrate;
   forming a dielectric collar around an upper portion of an inner electrode of the deep trench capacitor such that a portion of the inner electrode remains in direct contact with a top semiconductor layer of the semiconductor-on-insulator substrate;
   forming a buffer layer between a top pad layer and a bottom pad layer, the bottom pad layer being on top of the deep trench capacitor and on top of the semiconductor-on-insulator substrate;
   forming a fin pattern above the top pad layer using a sidewall image transfer technique, the fin pattern is defined by sidewall spacers, such that at least one of the sidewall spacers is directly above and aligned with at least a portion of the deep trench capacitor;
   removing a portion of the top pad layer selective to the sidewall spacers and selective to the buffer layer such that another portion of the top pad layer remains directly beneath the sidewall spacers; and
   forming a fin in direct contact with a strap by transferring the fin pattern from the top pad layer into the top semiconductor layer and the inner electrode of the deep trench capacitor, the fin is formed from a portion of the top semiconductor layer and the strap is formed from a portion of the inner electrode of the deep trench capacitor.

9. The method of claim 8, wherein forming the fin pattern comprises:
   forming a mandrel directly on top of the top pad layer;
   forming the sidewall spacers on opposite sidewalls of the mandrel; and
   removing the mandrel selective to the sidewall spacers.

10. The method of claim 8, wherein forming the fin and the strap comprises:
    transferring the fin pattern from the top pad layer into the buffer layer, the top pad layer being made from a nitride;
    transferring the fin pattern from the buffer layer into the bottom pad layer, the buffer layer being made from amorphous silicon; and
    transferring the fin pattern from the bottom pad layer into the top semiconductor layer and the inner electrode of the deep trench capacitor, the bottom pad layer being made from an oxide.

11. The method of claim 8, wherein the buffer layer is made from amorphous silicon.

12. The method of claim 8, wherein a lateral width of the one or more sidewall spacers is sublithographic.

13. The method of claim 8, further comprising:
    forming a gate electrode perpendicular to and covering top and both sides of the fin.

14. The method of claim 8, further comprising:
    growing epitaxy on exposed sidewalls and exposed top surfaces of both the fin and the strap, such that a portion of the epitaxy laterally surrounding the strap is constrained by the dielectric collar.

15. A method comprising:
    forming a buffer layer between a top pad layer and a bottom pad layer, the bottom pad layer being on top of a deep trench capacitor embedded in a substrate, the top pad layer being made from a nitride, the buffer layer being made form amorphous silicon, and the bottom pad layer being made from an oxide;
    forming a fin pattern above the top pad layer using a sidewall image transfer technique, the fin pattern is defined by one or more sidewall spacers, such that at least one of the one or more sidewall spacers is directly above and aligned with at least a portion of the deep trench capacitor;
    transferring the fin pattern into the top pad layer stopping of the buffer layer; and
    forming a fin in direct contact with a strap by transferring the fin pattern into the buffer layer, into the bottom pad layer, and into the substrate and an inner electrode of the deep trench capacitor, the fin is formed from a portion of the substrate and the strap is formed from a portion of the inner electrode.

16. The method of claim 15, wherein forming the fin pattern comprises:

forming a mandrel directly on top of the top pad layer;

forming the sidewall spacers on opposite sidewalls of the mandrel; and removing the mandrel selective to the sidewall spacers.

17. The method of claim 15, wherein forming the fin and the strap comprises:

transferring the fin pattern from the top pad layer into the buffer layer by etching the top pad layer selective to the sidewall spacers and selective to the buffer layer such that a portion of the top pad layer remains directly beneath the sidewall spacers without being undercut;

transferring the fin pattern from the buffer layer into the bottom pad layer by etching the buffer layer selective to the remaining portion of the top pad layer such that a portion of the buffer layer remains directly beneath the remaining portion of the to pad layer without being undercut; and transferring the fin pattern from the bottom pad layer into the substrate and the inner electrode by etching the substrate and the inner electrode selective to the remaining portion of the bottom pad layer such that a portion of the substrate and a portion of the inner electrode remains directly beneath the remaining portion of the bottom pad layer without being undercut.

18. The method of claim 15, wherein the buffer layer is made from amorphous silicon.

19. The method of claim 15, wherein a lateral width of the one or more sidewall spacers is sublithographic.

20. The method of claim 15, further comprising:

growing epitaxy on exposed sidewalls and exposed top surfaces of both the fin and the strap.

* * * * *